(12) United States Patent
Sharp

(10) Patent No.: US 6,169,245 B1
(45) Date of Patent: Jan. 2, 2001

(54) THERMOELECTRIC MATERIALS TERNARY PENTA TELLURIDE AND SELENIDE COMPOUNDS

(75) Inventor: Jeffrey W. Sharp, Richardson, TX (US)

(73) Assignee: Marlow Industries, Inc., Dallas, TX (US)

(*) Notice: Under 35 U.S.C. 154(b), the term of this patent shall be extended for 0 days.

(21) Appl. No.: 09/305,111

(22) Filed: May 4, 1999

Related U.S. Application Data

(60) Provisional application No. 60/084,349, filed on May 5, 1998.

(51) Int. Cl.$^7$ .................................................. H01L 35/30
(52) U.S. Cl. ..................... 136/205; 136/203; 136/238; 136/239; 136/241
(58) Field of Search ............................... 136/236.1, 238, 136/239, 241, 203, 205

(56) References Cited

U.S. PATENT DOCUMENTS

| | | | |
|---|---|---|---|
| 3,870,568 | * 3/1975 | Oesterhelt et al. | 136/212 |
| 5,064,476 | 11/1991 | Recine, Sr. | 136/201 |
| 5,171,372 | 12/1992 | Recine, Sr. | 136/203 |
| 5,368,701 | 11/1994 | Warren et al. | 204/59 QM |
| 5,441,576 | 8/1995 | Bierschenk et al. | 136/203 |
| 5,576,512 | 11/1996 | Doke | 136/203 |
| 5,610,366 | * 3/1997 | Fleurial et al. | 136/202 |

OTHER PUBLICATIONS

R. Marsh, "On the Structure of Tl$_2$GeTe$_5$", Journal of Solid State Chemistry, 1990, pp. 467–468. No month provided.

A.A. Toure, et al. "Sur le ternaire Tl–Ge–Te: Etude structurale de la phase Tl$_2$GeTe$_5$", Journal of Solid State Chemistry, 1990, pp. 245–252. No month provided.

V. Agafonov, et al., "Structure of Tl$_2$SnTe$_5$", International Union of Crystallography, 1991, pp. 850–852. No month provided.

G. Mahan, et al., "Thermoelectric Materials: New Approaches to an Old Problem", American Institute of Physics, Physics Today, Mar. 1997, pp. 42–47. No month provided.

B. Eisenmann, et al., "Plane, Zu Ketten Verknüpfte [Te$_5$]$^{6-}$–Anionen im K$_2$SnTe$_5$", Mat, Res. Bull. vol. 18, No. 4, 1983, pp. 383–387. No month provided.

J. Sharp, "Selection and Evaluation of Materials for Thermoelectric Applications II", Mat. Res. Soc. Symp. Proc., vol. 478, 1997, pp. 15–23. No month provided.

Jon. L. Schindler, et al., "Electrical Properties and Figures of Merit for New Chalcogenide–Based Thermoelectric Materials", Mat. Res. Soc. Symp. Proc., vol. 478, 1997, pp. 327–332. No month provided.

(List continued on next page.)

Primary Examiner—Kathryn Gorgos
Assistant Examiner—Thomas H Parsons
(74) Attorney, Agent, or Firm—Baker, Botts L.L.P.

(57) ABSTRACT

Ternary tellurium compounds and ternary selenium compounds may be used in fabricating thermoelectric devices with a thermoelectric figure of merit (ZT) of 1.5 or greater. Examples of such compounds include Tl$_2$SnTe$_5$, Tl$_2$GeTe$_5$, K$_2$SnTe$_5$ and Rb$_2$SnTe$_5$. These compounds have similar types of crystal lattice structures which include a first substructure with a (Sn, Ge) Te$_5$ composition and a second substructure with chains of selected cation atoms. The second substructure includes selected cation atoms which interact with selected anion atoms to maintain a desired separation between the chains of the first substructure. The cation atoms which maintain the desired separation between the chains occupy relatively large electropositive sites in the resulting crystal lattice structure which results in a relatively low value for the lattice component of thermal conductivity ($\kappa_g$). The first substructure of anion chains indicates significant anisotropy in the thermoelectric characteristics of the resulting semiconductor materials.

6 Claims, 7 Drawing Sheets

OTHER PUBLICATIONS

D. Chung, et al., "Searching for New Thermoelectrics in Chemically and Structurally Complex Bismuth Chalcogenides", Mat. Res. Soc. Symp. Proc., vol. 478, 1997, pp. 333–344. No month provided.

T. Kajikawa, et al., "Thermoelectric Properties of Sintered Magnesium Compounds", IEEE, 1996, pp. 128–132. No month provided.

C. Brinkmann, et al., Neue Polytelluridostannate (IV): Zur Kenntnis von $Rb_2SnTe_5$ und $Cs_4Sn_2Te_7$, Mat. Res. Bull., vol. 20, 1985, pp. 299–307.

J. Corbett, "Polyatomic Zintl Anions of the Post–Transition Elements", American Chemical Society, vol. 85, No. 5, 1985, pp. 383–397. No month provided.

H.J. Goldsmid, et al., "The Use of Semiconductor in Thermoelectric Refrigeration", British Journal of Applied Physics, vol. 5, Nov. 1954, pp. 386–390.

"Semiconductor Materials with Skutterudite Type Crystal Lattice Structures Optimized for Selected Thermoelectric Properties and Methods of Preparation", Patent Application No. 09/111,690, filed Jul. 8, 1998, Inventor: George S. Nolas, pending.

"Thermoelectric Materials Fabricated from Clathrate Compounds and Other Materials Which Form an Inclusion Complex and Method for Optimizing Selected Thermoelectric", Patent Application No. 09/233,359, filed Jan. 18, 1999, Inventor: George S. Nolas, pending.

Hoffman, "$Cs_3Te_{22}$, The One We Now Know", American Scientist, vol. 84, pp. 327–329, Jul./Aug. 1996.

* cited by examiner

Tl₂GeTe₅

○ Ge-256   ⊗ Te-257
○ Tl-260, 261

$Tl_2 Ge Te_5$

THERMOELECTRIC MATERIALS TERNARY PENTA TELLURIDE AND SELENIDE COMPOUNDS

RELATED APPLICATIONS

This application claims the benefit of previously filed Provisional Application Ser. No. 60/084,349 filed May 5, 1998 entitled "New Thermoelectric Materials: $Tl_2SnTe_5$ and related compounds."

LICENSE

The U.S. Government may have a paid-up license in this invention and the right in limited circumstances to require the patent owner to license others on reasonable terms as provided for by the terms of Cooperative Research and Development Agreement (CRADA) No. ORNL 94-0324 awarded by the United States Department of Energy.

BACKGROUND OF THE INVENTION

1. Technical Field of the Invention

This invention relates to semiconductor materials having enhanced thermoelectric properties for use in fabricating thermoelectric devices.

2. Description of the Related Art

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of materials used in fabrication of the associated thermoelectric elements. Materials used to fabricate other components such as electrical connections, hot plates and cold plates may also affect the overall efficiency of the resulting thermoelectric device.

The thermoelectric figure of merit (ZT) is a dimensionless measure of the effectiveness of a thermoelectric device and is related to material properties by the following equation:

$$ZT = S^2 \sigma T / \kappa \quad (1)$$

where S, $\sigma$, $\kappa$, and T are the Seebeck coefficient, electrical conductivity, thermal conductivity and absolute temperature, respectively. The Seebeck coefficient (S) is a measure of how readily the respective carriers (electrons or holes) can transfer energy as they move through a thermoelectric element which is subjected to a temperature and electric potential gradient. The type of carrier (electron or hole) is a function of the materials selected to form each thermoelectric element.

The electrical properties (sometimes referred to as electrical characteristics, electronic properties, or electronic characteristics) associated with materials used to form thermoelectric elements may be represented by $S^2\sigma$. Many of the materials which are used to form thermoelectric elements may be generally described as semiconductor compounds or semiconductor materials. Examples of such materials will be discussed later in more detail.

The thermoelectric figure of merit is also related to the strength of interactions between the carriers and vibrations of the crystal lattice structure (phonons) and available carrier energy states. Both the crystal lattice structure and the carrier energy states are a function of the materials selected to form each thermoelectric device. As a result, thermal conductivity ($\kappa$) is a function of both an electronic component ($\kappa_e$) primarily associated with the respective carriers and a lattice component ($\kappa_g$) primarily associated with the respective crystal lattice structure and propagation of phonons through the respective crystal lattice structure. In the most general sense, thermal conductivity may be stated by the equation:

$$\kappa = \kappa_e + \kappa_g \quad (2)$$

The thermoelectric figure of merit (ZT) may also be stated by the equation:

$$ZT = \frac{S^2 T}{\rho \kappa} \quad (3)$$

$\rho$ = electrical resistivity $\sigma$ = electrical conductivity $$\text{electrical conductivity} = \frac{1}{\text{electrical resistivity}} \text{ or } \sigma = \frac{1}{\rho}$$

Thermoelectric materials such as alloys of $Bi_2Te_3$, PbTe and BiSb were developed thirty to forty years ago. More recently, semiconductor alloys such as SiGe have been used in the fabrication of thermoelectric devices. Commercially available thermoelectric materials are generally limited to use in a temperature range between 200K and 1300K with a maximum ZT value of approximately one. The coefficient of performance of such thermoelectric devices remains relatively low at approximately one, compared to approximately three for a mechanical device. For the temperature range of −100° C. to 1000° C., maximum ZT for many state of the art thermoelectric materials also remains limited to values of approximately 1, except for Te—Ag—Ge—Sb alloys (TAGS) which may achieve a ZT of 1.2 to 1.4 in a relatively narrow temperature range. Materials such as $Si_{80}Ge_{20}$ alloys used in thermoelectric generators to power spacecrafts for deep space missions have an average thermoelectric figure of merit of approximately equal to 0.5 from 300° C. to 1,000° C.

Many crystalline materials with low thermal conductivity do not have good electrical conductivity and many crystalline materials with good electrical conductivity often have relatively high values of thermal conductivity. For example, many binary semiconductor compounds which have skutterudite type crystal lattice structures have relatively good electrical properties. However, the value of thermal conductivity associated with the crystal lattice structures of such semiconductor compounds is generally relatively large which often results in a thermoelectric figure of merit which is less than desired.

The terms "Zintl phase" and "Zintl compound" are often used to describe intermetallic compounds having metal polyanions which have no exopolyhedral ligands at the respective vertices. As a result, it is relatively easy for such polyanions to form metal to metal bonds with atoms of the main metal group and transition metal group. U.S. Pat. No. 5,368,701 entitled Process for Forming Zintl Phases And The Products Thereof provides additional information concerning such materials and their electrical characteristics.

Alternatively, the terms "Zintl phase" and "Zintl compound" may be used to describe a binary compound formed between the alkali or alkaline-earth elements and the main-group elements from group 14 to the right of the "Zintl boundary." F. Laves, *Naturwissenschaften* 29 (1941), p. 244. Some of the features that typify Zintl phases began to be introduced in E. Zintl, W. Z. Dullenkopf, *Z. Phys. Chem., Abt.* B 16 (1932), p. 183. The definition and both references are taken from John D. Corbett, *Chem. Rev.* 85 (1985), p. 383–397.

$K_2SnTe_5$ compounds are described in Eisenmann et al., Materials Research Bulletin, vol. 18 (1983), pp. 383–387. $Tl_2GeTe_5$ compounds are described in Abba Toure et al., Journal of Solid State Chemistry, vol. 84 (1990), pp. 245–252; Marsh, Journal of Solid State Chemistry, vol. 87 (1990), pp. 467–468. $Tl_2SnTe_5$ compounds are described in Agafonov et al., Acta Crystallographica C, vol. 47 (1991), pp. 850–852. Zintl phases have been proposed as a place to look for advanced thermoelectric materials. See Sharp, Materials Research Society Symposium Proceedings, vol. 478, pp. 15–24.

Two other researchers have suggested possibly using Zintl phase compounds as thermoelectric materials.

$SrSi_2$—Bruce Cook—Ames National Laboratory $BaSbTe_3$ and $CsSb_xTe_4$—Mercouri Kanatzidis—Michigan State Some Zintl compounds may be described as clathrate compounds and some clathrate compounds may be described as Zintl compounds. However, many clathrate compounds are not Zintl compounds and many Zintl compounds are not clathrate compounds.

SUMMARY OF THE INVENTION

In accordance with teachings of the present invention, the design and preparation of semiconductor materials for fabrication of thermoelectric devices has been substantially improved to provide enhanced operating efficiencies. Examples of such semiconductor materials include, but are not limited to, $Tl_2SnTe_5$, $Tl_2GeTe_5$, $K_2SnTe_5$, $Rb_2SnTe_5$ and alloys or mixtures of these compounds.

The present invention provides the ability to obtain increased efficiency from a thermoelectric device having one or more thermoelectric elements fabricated from semiconductor materials having the general formula of $X_2YZ_5$ where X represents atoms selected from a group which includes Tl, Cs, K, Na and Rb. Y represents atoms selected from a group which includes Si, Ge and Sn. Z represents atoms selected from a group which includes Te and Se. For some applications X may represent indium (In), copper (Cu) or silver (Ag).

One aspect of the present invention includes fabricating thermoelectric elements from semiconductor materials having a crystal lattice structure composed of a chain of $YZ_4$ tetrahedra linked by a Z atom in a square planar environment. For some applications, Y represents atoms selected from a group which includes silicon (Si), germanium (Ge) and tin (Sn) and, Z represents atoms selected from a group which includes tellurium (Te) and selenium (Se). For still other applications a thermoelectric element may be fabricated in accordance of teachings of the present invention from intermetallic ternary telluride compounds and intermetallic ternary selenide compounds.

Semiconductor materials having crystal lattice structures formed in accordance with the teachings of the present invention optimize selected thermoelectric characteristics of a resulting thermoelectric device. A significant reduction in thermal conductivity ($\kappa$) may be achieved by establishing relatively long metallic bonds between Te atoms and Tl atoms in the resulting crystal lattice structure. By selecting atoms to form a Zintl compound in accordance with teachings of the present invention, thermal conductivity ($\kappa$) through the resulting crystal lattice structure may be significantly reduced while at the same time minimizing any reduction in electrical properties ($S^2\sigma$) of the associated semiconductor materials.

Another aspect of the present invention includes forming a crystal lattice structure having two substructures which cooperate with each other to optimize the reduction in thermal conductivity ($\kappa$) of the associated crystal lattice structure while at the same time minimizing any reduction in electrical properties which results in maximizing the thermoelectric figure of merit for the resulting thermoelectric device. Semiconductor materials having a crystal lattice structure typically associated with Zintl compounds or Zintl phases formed from atoms selected in accordance with teachings of the present invention may demonstrate an order of magnitude decrease in the lattice component of thermal conductivity ($\kappa_g$) in comparison with materials previously used to fabricate thermoelectric elements. Thermoelectric devices with thermoelectric elements fabricated from semiconductor materials with such crystal lattice structures may have substantially enhanced thermoelectric operating characteristics and improved efficiencies as compared to previous thermoelectric devices.

In accordance with another aspect of the present invention, both N-type and P-type semiconductor materials with crystal lattice structures similar to those typically associated with Zintl compounds or Zintl phases may be used to fabricate thermoelectric elements for a thermoelectric device. Fabricating a thermoelectric device with such semiconductor materials may substantially enhance the associated operating efficiency as compared to previous thermoelectric devices. Preliminary testing of transport properties indicates that a thermoelectric figure of merit (ZT) of 1.5 or greater is a reasonable expectation for semiconductor materials designed and prepared in accordance with teachings of the present invention. Thermoelectric devices fabricated from such semiconductor materials may be used for cooling, heating, electrical power generation and temperature sensing. Some estimates indicate that providing both N-type and P-type semiconductor materials with a ZT equal to or greater than 1.5 may double the value of the world market for thermoelectric devices.

A ZT of 1.25 for both N-type and P-type materials would make portable freezers based on thermoelectric technology an economically feasible product. Current inexpensive thermoelectric cooling systems are generally limited to operating in refrigeration temperature ranges. Thermoelectric cooling of microprocessors will benefit from enhanced ZT, which is potentially a very large market for thermoelectric devices. Larger increases in ZT could result in widespread use of thermoelectric refrigeration and all-solid state cryocooling. Various ternary intermetallic compounds and ternary semiconductor compounds may be formed in accordance with teachings of the present invention for use in fabricating N-type and P-type thermoelectric elements.

BRIEF DESCRIPTION OF THE DRAWINGS

For a more complete understanding of the present invention and its advantages, reference is now made to the following descriptions taken in conjunction with the accompanying drawings in which.

DETAILED DESCRIPTION OF THE INVENTION

Preferred embodiments of the present invention and its advantages are best understood by now referring in more detail to FIGS. 1–10 of the drawings, in which like numerals refer to like parts.

Figure 1:
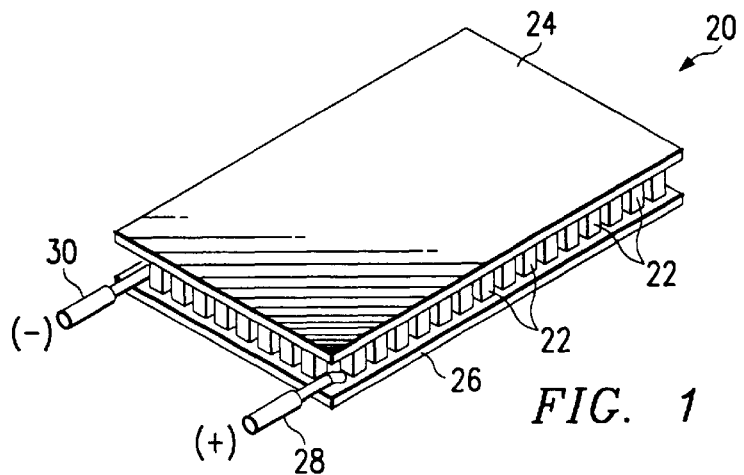
FIG. 1 is a schematic drawing showing an isometric view of a thermoelectric device having multiple thermoelectric elements which may be fabricated from semiconductor materials with crystal lattice structures incorporating teachings of the present invention.
Figure 2:
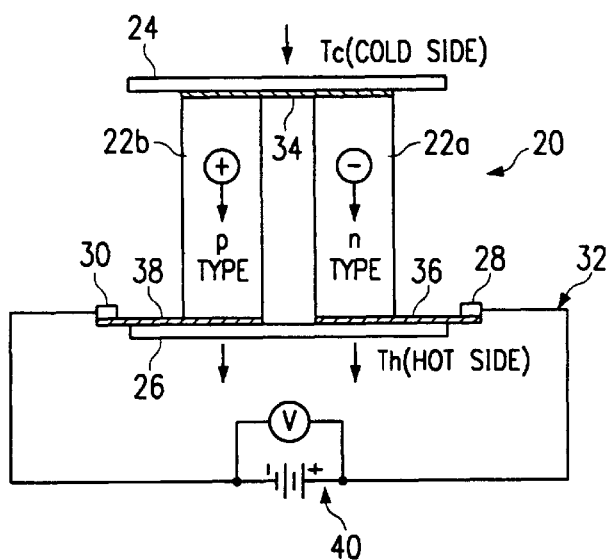
FIG. 2 is an electrical schematic drawing of one thermocouple of the thermoelectric device of FIG. 1.

Thermoelectric device 20, as shown in FIGS. 1 and 2, may be fabricated from semiconductor materials having crystal lattice structures formed in accordance with teachings of the present invention. Selecting atoms to form the desired crystal lattice structure in accordance with teachings of the present invention allows optimization of various thermoelectric characteristics depending upon the intended use of the resulting thermoelectric device 20.

Thermoelectric device 20 may be used as a heater, cooler, electrical power generator and/or temperature sensor. The thermoelectric figure of merit (ZT) of thermoelectric device 20 will vary depending upon the type of use. For example, thermoelectric device 20 may have a first value of ZT when used as a cooler and a second, different value of ZT when used as an electrical power generator. One of the technical benefits of the present invention includes selecting atoms to form the desired crystal lattice structure to optimize performance of thermoelectric device 20 depending upon its intended use.

Thermoelectric device 20 is preferably manufactured with a plurality of thermoelectric elements (sometimes referred to as "thermocouples") 22 disposed between cold plate 24 and hot plate 26. Electrical connections 28 and 30 are provided to allow attaching thermoelectric device 20 to an appropriate source of DC electrical power. If thermoelectric device 20 were designed to function as an electrical power generator, electrical connections 28 and 30 would represent the output terminals from such a power generator operating between hot and cold temperature sources (not expressly shown).

FIG. 2 is a schematic representation of electrical circuit 32 which is typical for a single stage thermoelectric device such as thermoelectric device 20. Electrical circuit 32 is also typical of electrical circuits associated with using thermoelectric elements or thermocouples to convert heat energy into electrical energy. Electric circuit 32 generally includes two or more thermoelectric elements 22 fabricated from dissimilar semiconductor materials such as N-type thermoelectric element 22a and P-type thermoelectric elements 22b. Thermoelectric elements 22 are typically arranged in an alternating N-type element to P-type element configuration. In many thermoelectric devices, semiconductor materials with dissimilar characteristics are connected electrically in series and thermally in parallel.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; U.S. Pat. No. 5,441,576 entitled Thermoelectric Cooler; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 24 and hot side or hot plate 26 through thermoelectric elements 22 when subject to a DC voltage potential. These same agents or carriers may generate electrical power when an appropriate temperature difference is present between cold side 24 and hot side 26.

In thermoelectric device 20, alternating thermoelectric elements 22a and 22b of N-type and P-type semiconductor materials may have their ends connected in a serpentine fashion by electrical conductors such as 34, 36 and 38. Conductors 34, 36 and 38 are typically metallizations formed on the interior surfaces of plates 24 and 26. Ceramic materials are frequently used to manufacture plates 24 and 26 which define in part the cold side and hot side, respectively, of thermoelectric device 20. Commercially available thermoelectric devices which function as a cooler generally include two ceramic plates with P-type and N-type thermoelectric elements formed from bismuth telluride ($Bi_2Te_3$) alloys disposed between the ceramic plates and electrically connected with each other.

When DC electrical power from power supply 40 is properly applied to thermoelectric device 20 heat energy will be absorbed on cold side 24 of thermoelectric device 20. The heat energy will pass through thermoelectric elements 22 and will be dissipated on hot side 26 of thermoelectric device 20. A heat sink or heat exchanger (sometimes referred to as a "hot sink", not shown) may be attached to hot plate 26 of thermoelectric device 20 to aid in dissipating heat transferred by the associated carriers and phonons through thermoelectric elements 22 to the adjacent environment. In a similar manner, a heat sink or heat exchanger (sometimes referred to as a "cold sink", not shown) may be attached to cold side 24 of thermoelectric device 20 to aid in removing heat from the adjacent environment. Thus, thermoelectric device 20 may sometimes function as a thermoelectric cooler when properly connected with power supply 40. However, since thermoelectric devices are a type of heat pump, thermoelectric device 20 may also function as a heater, power generator, or temperature sensor.

Various Zintl compounds or Zintl phases have electrical characteristics typically associated with a good semiconductor material. For purposes of this patent application, the terms "Zintl compound" and "Zintl phase" shall mean an intermetallic compound with one element of the Periodic Table (cation atoms) selected from alkali metal atoms and/or alkaline earth metal atoms and one or more elements of the Periodic Table (anion atoms) selected from the main group of metal atoms. The cation atoms are preferably selected from group 1 and/or group 2 atoms of the Periodic Table. The anion atoms are preferably selected from group 13 through group 18 of the Periodic Table. The main group of metal atoms includes gallium, germanium, arsenic, selenium, indium, tin, antinomy, tellurium, thallium, lead and bismuth. Titanium, vanadium, chromium, manganese, iron, cobalt, nickel, copper, zirconium, niobium, molybdenum, ruthenium, zinc, cadmium, rhodium, palladium, silver, hafnium, tantalum, tungsten, mercury, rhenium, osmium, iridium and platinum are also considered members of the metal group for purposes of defining Zintl compounds satisfactory for use in accordance with teachings of the present invention.

Vibrational modes of a crystal lattice structure (sometimes referred to as "phonons") may also cooperate with the carriers to transport or move heat energy through thermoelectric elements 22. The phonons may adversely effect some of the electrical properties associated with the respective carriers.

Semiconductor materials having the general formula $X_2YZ_5$ may be prepared in accordance with teachings of the present invention for use in fabricating various types of thermoelectric elements and thermoelectric devices. One example of such thermoelectric elements and devices is shown in FIGS. 1 and 2.

X preferably represents atoms selected from a group which includes thallium (Tl), cesium (Cs), potassium (K), sodium (Na) and rubidium (Rb). For some applications X may represent atoms of indium (In), copper (Cu) and silver (Ag). Y preferably represents atoms selected from a group which includes silicon (Si), germanium (Ge) and tin (Sn). For some applications, Y may also represent atoms of titanium, vanadium, chromium, manganese, iron, cobalt, nickel, copper, zirconium, niobium, molybdenum, ruthenium, rhodium, palladium, silver, hafnium, tantalum, tungsten, rhenium, osmium, iridium and platinum.

Z preferably represents atoms selected from a group which includes tellurium (Te) and selenium (Se). Examples of such semiconductor materials include, but are not limited to, $Tl_2SnTe_5$, $Tl_2GeTe_5$ and $K_2SnTe_5$ and $Rb_2SnTe_5$ and alloys of these compounds. The semiconductor materials may be described as intermetallic ternary penta telluride compounds when Z represents tellurium atoms. The semiconductor materials may be described as intermetallic ternary penta selenide compounds when Z represents selenium atoms.

When X represents atoms of cesium (Cs), potassium (K), sodium (Na) or rubidium (Rb), the resulting semiconductor materials may also be described as Zintl compounds or Zintl phases. $K_2SnTe_5$ and $Rb_2SnTe_5$ are examples of Zintl compounds which may be used in accordance with teachings of the present invention to fabricate thermoelectric elements 22. $Tl_2SnTe_5$ has a crystal lattice structure which is substantially the same as $K_2SnTe_5$ even though $Tl_2SnTe_5$ is not normally considered a Zintl compound.

Figure 3A:
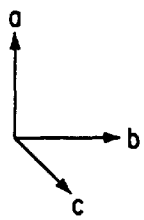
FIG. 3A shows the axes of a unit cell associated with the crystal lattice structure of FIG. 3B.
Figure 3B:
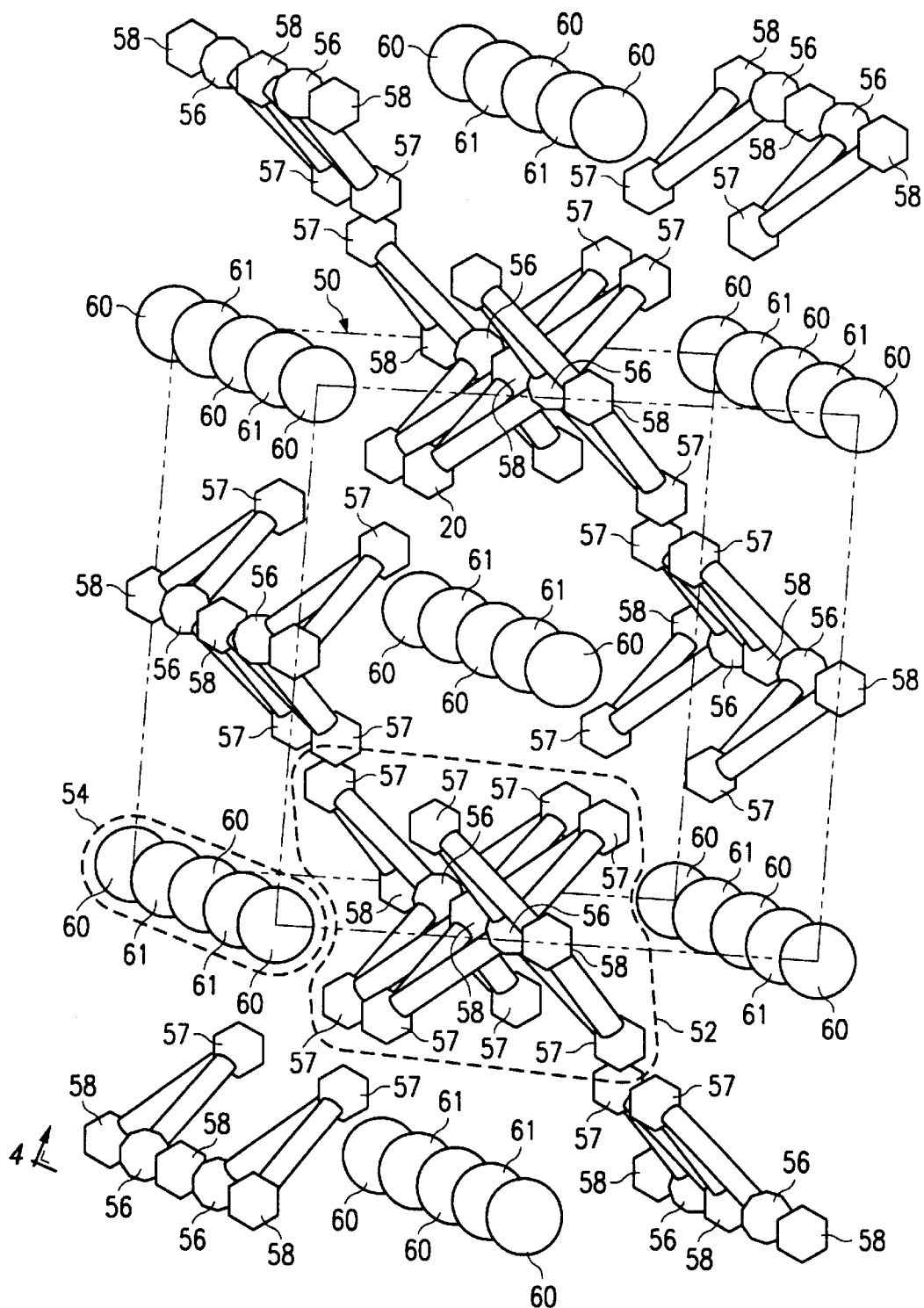
FIG. 3B is an enlarged isometric drawing showing a schematic representation of a typical crystal lattice structure formed in accordance with teachings of the present invention by semiconductor materials having a general formula such as $Tl_2SnTe_5$.
Figure 4:
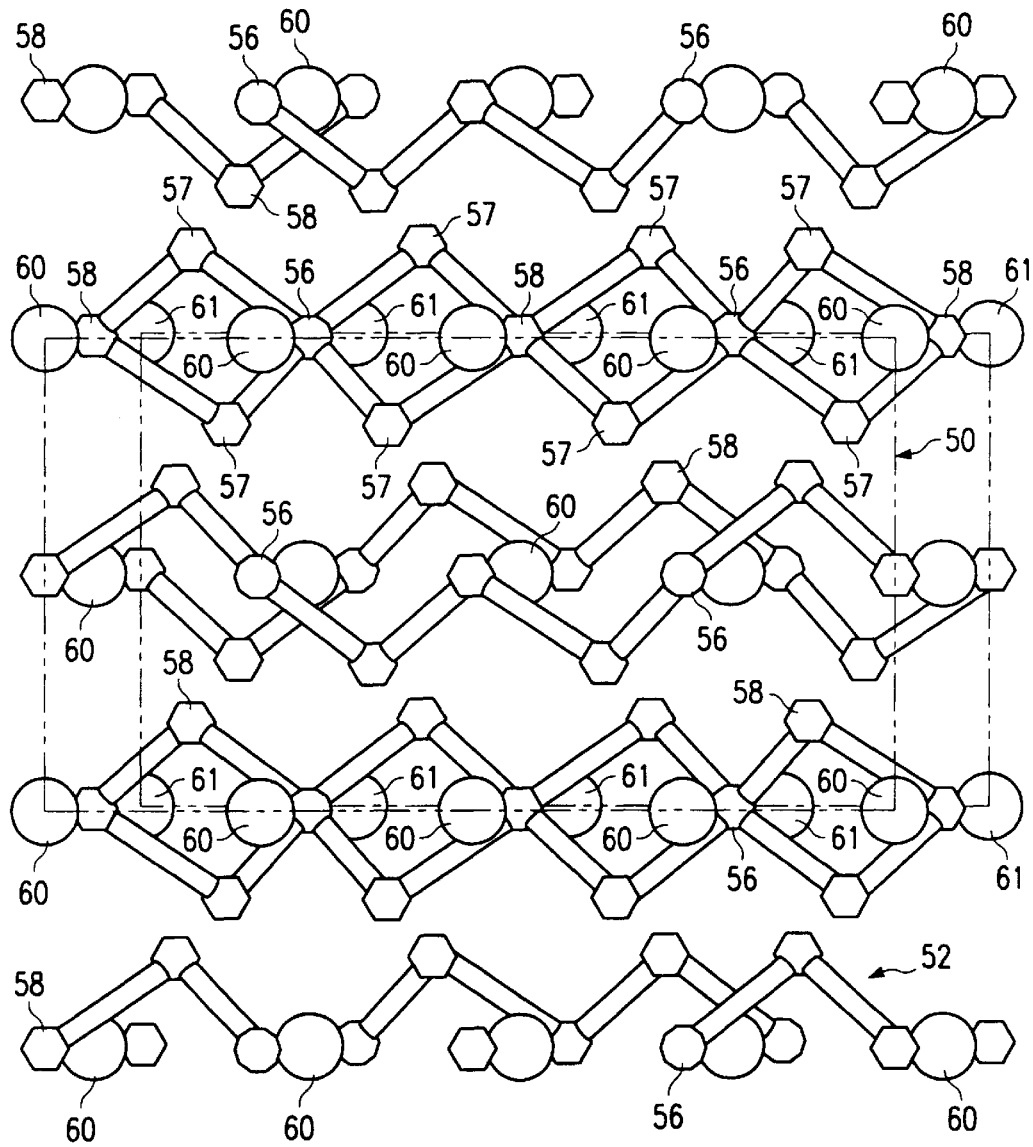
FIG. 4 is a schematic representation of the crystal lattice structure of FIG. 3B taken along lines 4—4.
Figure 7:
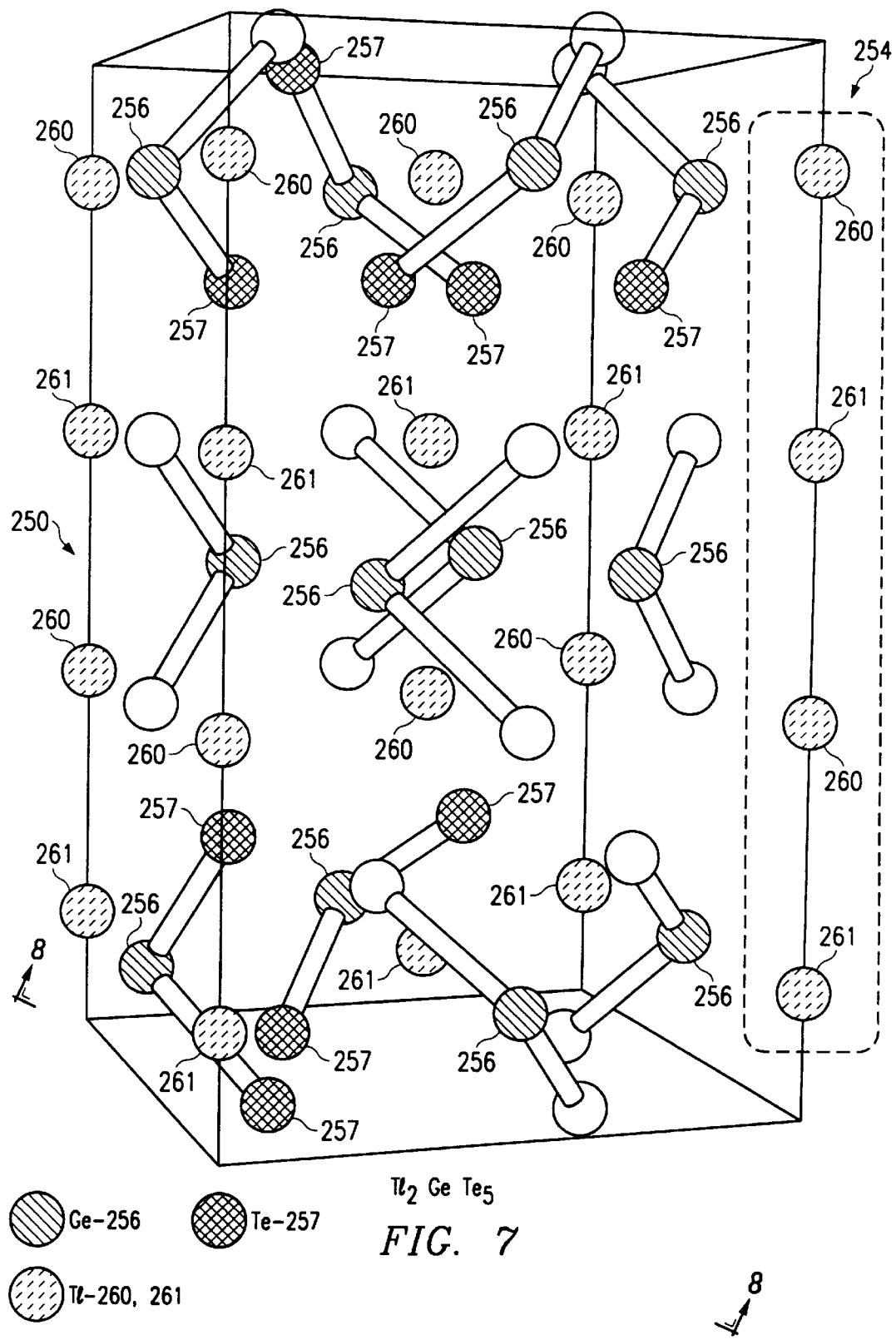
FIG. 7 is an enlarged isometric drawing showing a schematic representation of a typical crystal lattice structure formed in accordance with teachings of the present invention by semiconductor materials having a general formula such as $Tl_2GeTe_5$.
Figure 8:
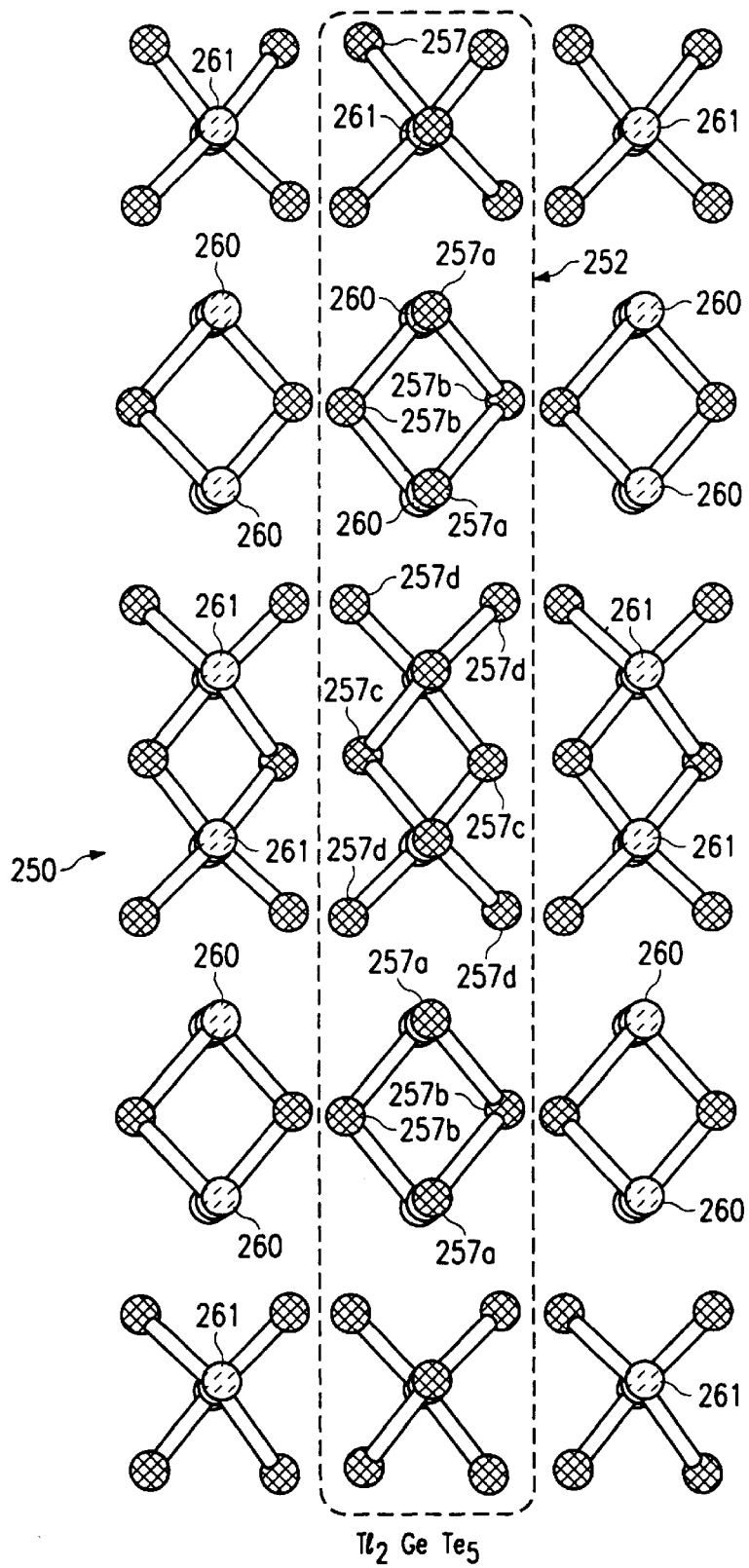
FIG. 8 is a schematic representation of the crystal lattice structure of FIG. 7 taken along lines 8—8.

Semiconductor materials formed in accordance with teachings of the present invention may also be described as "ternary intermetallic compounds" and "ternary semiconductor compounds." Both single crystal and polycrystalline versions of such semiconductor materials having crystal lattice structures such as represented by unit cell 50 shown in FIGS. 3B and 4 or unit cell 250 shown in FIGS. 7 and 8 may be fabricated in accordance with teachings of the present invention. The phrase "semiconductor materials" is used in this application to include semiconductor compounds, semiconductor alloys and mixtures of semiconductor compounds and alloys formed in accordance with teachings of the present invention for use in fabricating thermoelectric elements and thermoelectric devices.

Zintl compounds satisfactory for use in fabricating thermoelectric elements in accordance with teachings of the present invention preferably have a relatively large atomic mass (100 atomic mass units or greater) and a relatively low proportion of cation atoms (33% or less) as compared to the total number of atoms.

FIGS. 3B and 4 are schematic drawings of a typical crystal lattice structure associated with semiconductor materials such as $Tl_2SnTe_5$. The crystal lattice structure is defined in part by unit cell 50 which includes first substructure 52 and second substructure 54. Unit cell 50 has a generally tetragonal configuration with two axii (a, b) which are equivalent and one axis (c) which is non-equivalent. See FIG. 3A. Chains or first substructures 52 are formed by $SnTe_5$ tetrahedran aligned generally parallel with each other in the direction of the (c) axis. The tin (Sn) atoms are represented by the number 56. The tellurium (Te) atoms are preferably disposed at respective crystallographic sites designated 57 and 58. Chains or second substructures 54 are rows of thallium (Tl) atoms 60 and 61 aligned generally parallel with each other in the direction of the (c) axis.

One aspect of the present invention includes selecting the atoms used to form first substructure 52 and second substructure 54 to provide semiconductor materials having both good electrical characteristics and low values of thermal conductivity. $Tl_2SnTe_5$ is only one example of semiconductor materials which may be used to form a crystal lattice structure incorporating teachings of the present invention.

For the specific embodiment shown in FIG. 3, each first substructure 52 may be described as a respective chain of tin atoms 56 and tellurium atoms 57 and 58 linked with each other. Each second substructure 54 includes a respective chain of thallium atoms 60 and 61 linked with each other.

First substructure 52 may be formed from various atoms such as tin and tellurium to provide electrical characteristics typically associated with good semiconductor materials. Interaction between tellurium atoms of first substructure 52 and thallium atoms of second substructure 54 results in the associated crystal lattice structure represented by unit cell 50 having low values of thermal conductivity. Preliminary test results indicate that the lattice component of thermal conductivity ($\kappa_g$) may be approximately twenty-five percent (25%) of the lattice component of thermal conductivity ($\kappa_g$) associated with $Bi_2Te_3$ and approximately fifty percent (50%) of the lattice component of thermal conductivity ($\kappa_g$) associated with other semiconductor materials presently used to fabricate thermoelectric elements.

As discussed later in more detail, forming unit cell 50 from atoms selected in accordance with teachings of the present invention results in a relatively long bond distance between tellurium atoms 57 and thallium atoms 60 and 61. See FIGS. 5 and 6. First substructure 52 and second substructure 54 cooperate with each other to provide the desired metallic coordination between thallium atoms 60 and 61 and tellurium atoms 57 to reduce the lattice component of thermal conductivity ($\kappa_g$) and support good electrical characteristics of the associated semiconductor material.

Electrical characteristics of a crystal lattice structure represented by unit cell 50 are dependent upon the relationship of tin atoms 56 and associated tellurium atoms 57 and 58 of first substructure 52. The bonds between the atoms of first substructure 52 remain substantially unchanged by the presence of thallium atoms 60 and 61 in second substructure 54. The respective chains of atoms associated with first substructure 52 and second substructure 54 indicate that electrical characteristics and thermoelectric characteristics of a crystal lattice structure represented by unit cell 50 will be relatively anisotropic. Computational results have confirmed such electrical anisotropic characteristics.

For semiconductor materials such as $Tl_2SnTe_5$ first substructure 52 may also be described as single tetrahedra defined in part by a single Sn atom 56 and four Te atoms 57 linked by a respective Te atom 58 in a square planar environment. The relationship between $SnTe_4$ tetrahedra and Te atoms 58 for semiconductor materials such as $Tl_2SnTe_5$ may be further described by referring to $SnTe_4$ tetrahedra (Sn-56 and Te-57) as unit A and Te atoms 58 as unit B. The sequence within the atomic chains of first substructure 52 may then be described as "ABABABAB . . ." for semiconductor materials such as $Tl_2SnTe_5$.

Semiconductor materials having the general formula $X_2YZ_5$ and a crystal lattice structure such as represented by unit cell 50 preferably have Z atoms such as tellurium or selenium at two different crystallographic sites and X atoms at two different crystallographic sites. For the specific example shown in FIGS. 3B and 4, the first crystallographic sites for tellurium (Te) atoms 57 in substructure 52 are located at the corners of a square defined by such tellurium atoms 57. The second crystallographic sites for tellurium atoms 58 in unit cell 50 are located at the center of each respective square defined by four tellurium atoms 57. Tellurium atoms 57 occupying the first crystallographic sites interact with thallium atom 60 and also have a single bond with the associated tin atoms 56.

Figure 5:
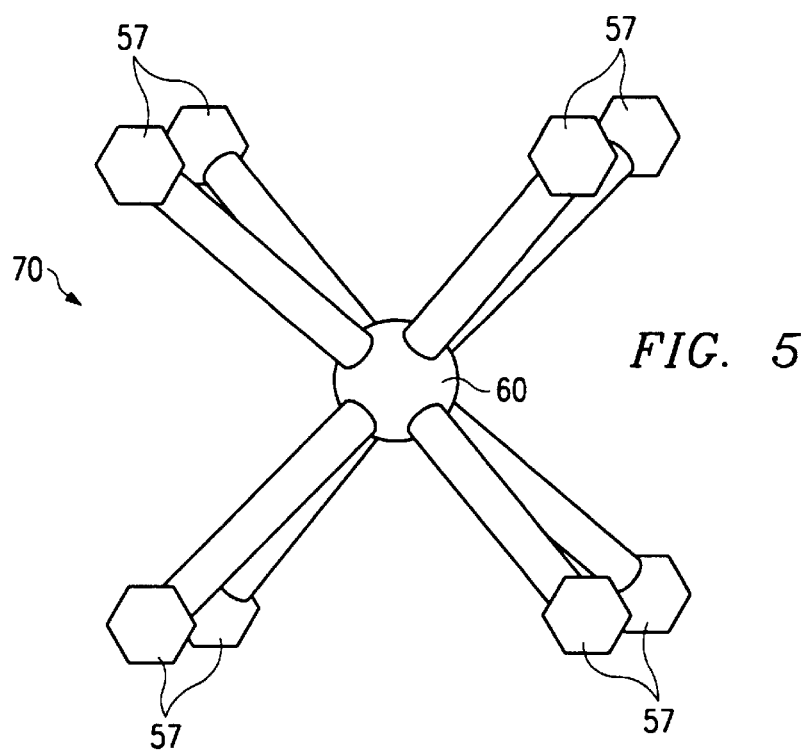
FIG. 5 is an isometric drawing showing a schematic representation of a subcell associated with thallium atoms at the first of two crystallographic sites in the crystal lattice structure of FIG. 3B having a generally cubic configuration defined by eight atomic crystallographic sites filled with tellurium (Te) atoms and the associated atomic crystallographic site filled with a thallium (Tl) atom located near the center of the subcell.
Figure 6:
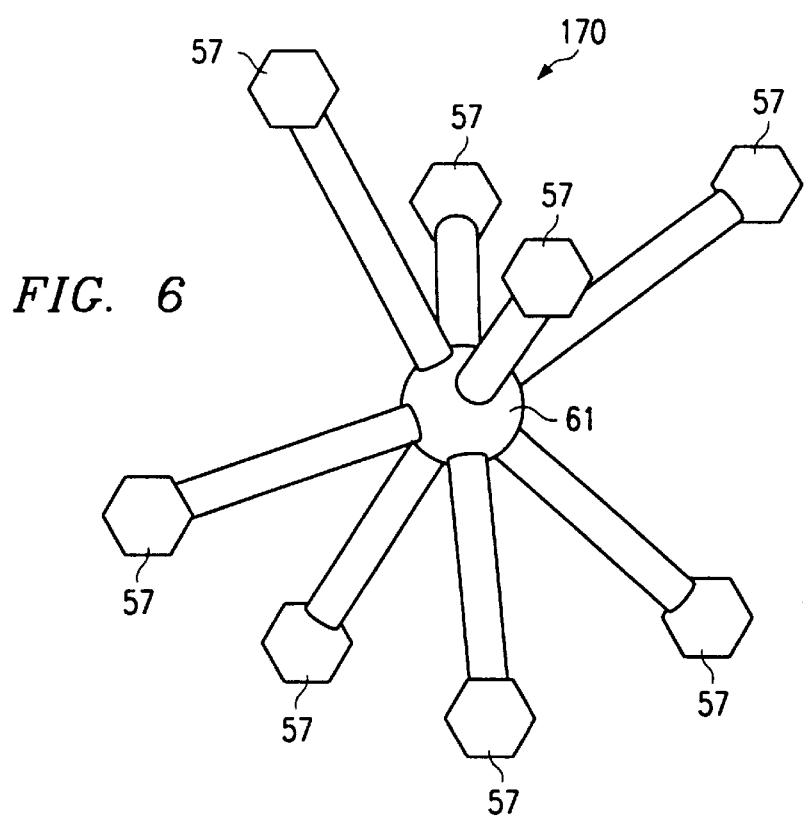
FIG. 6 is an isometric drawing showing a schematic representation of another subcell associated with thallium atoms at the second of the two crystallographic sites in the crystal lattice structure of FIG. 3B having a generally cubic antiprism configuration defined by eight atomic crystallographic sites filled with tellurium (Te) atoms and the associated atomic crystallographic site filled with a thallium (Tl) atom located near the center of the subcell.

The two different crystallographic sites associated with thallium atoms 60 and 61 are shown in more detail in FIGS. 5 and 6. At each crystallographic site the respective thallium atoms 60 and 61 have eight neighboring tellurium atoms 57 with different symmetries, different bond lengths and different geometric configurations. The relatively long bond length between tellurium atoms 57 and thallium atoms 60 and 61 as shown in FIGS. 5 and 6 results in relatively low values of thermal conductivity for the associated crystal lattice structure.

FIG. 5 is a schematic representation of subcell 70 associated with first substructure 52 of unit cell 50. Subcell 70 has a generally cubic configuration with eight atomic crystallographic sites filled by respective tellurium atoms 57 and a single thallium atom 60 located at an atomic crystallographic site near the center of the resulting cubic structure. For semiconductor materials such as $Tl_2SnTe_5$ the length of the bond coordination between thallium atoms 60 at the center of respective subcell 70 and tellurium atoms 57 at their respective crystallographic sites is approximately 3.66 Å.

FIG. 6 is a schematic representation of subcell 170 which is associated with thallium atoms 61 located at a plurality of second crystallographic sites in first substructure 52 of the crystal lattice structure represented by unit cell 50. Subcell 170 may be described as a generally cubic antiprism having eight neighboring atomic crystallographic sites filled by respective tellurium atoms 57 and a single thallium atom 60 located at an atomic crystallographic site near the center of the resulting cubic antiprism. The bond length between thallium atoms 61 located at the crystallographic site near the center of respective subcells 170 and tellurium atoms 57 at their respective atomic crystallographic sites is approximately 3.49 Å. Subcells 70 and 170 both have an eightfold bond coordination between respective thallium atoms 60 and 61 and associated tellurium atoms 57.

Unit cell 50 is a schematic representation of the crystal lattice structure associated with semiconductor compounds such as $K_2SnTe_5$ and $Tl_2SnTe_5$ and alloys of these materials which have been formed in accordance with teachings of the present invention. Unit cell 50 has a generally tetragonal configuration and contains four formula units (32 atoms). Typical cell dimensions are a=8.306 Å and c=15.161 Å for $Tl_2SnTe_5$, and are similar for the other compounds. The ideal density of $Tl_2SnTe_5$ is 7.40 grams per cubic centimeter. The space groups given in the literature are I4/mcm, P4/mbm and I4cm for $Tl_2SnTe_5$, $Tl_2GeTe_5$ and $K_2SnTe_5$ respectively.

In all of these compounds, there are chains formed from linkage of $SnTe_4$ (or $GeTe_4$) tetrahedra and Te atoms in a square plane environment. In $Tl_2SnTe_5$ and $K_2SnTe_5$, the linkage is —Te—$SnTe_4$—Te—$SnTe_4$—Te—$SnTe_4$—. In all three compounds, 80% of the Te atoms have two covalent bonds (excluding the interaction with Tl atoms), and the remainder has four bonds in the square planar configuration. All Te—Te bonds in these compounds can be considered fractional, with a bond order of one half (½). Tl has two different eight-fold coordination sites represented by subcell 70 shown in FIG. 5 as generally cubic and subcell 170 shown in FIG. 6 as a square antiprism. Subcells 70 and 170 may also be described as slightly distorted as compared to an ideal subcell. The atomic configurations and the existence of $K_2SnTe_5$ imply that Tl is monovalent and Sn and Ge are tetravalent.

With regard to thermal conductivity, $Tl_2SnTe_5$ and $Tl_2GeTe_5$ are very similar. Both have lattice thermal conductivity values of about 4.0 to 4.5 mW/cm-K in our hot pressed samples. This value is about four times lower than values typically associated with $Bi_2Te_3$ compounds.

FIGS. 7 and 8 are schematic drawings of a typical crystal lattice structure associated with semi-conductor materials such as $Tl_2GeTe_5$. The crystal lattice structure is defined in part by unit cell 250 which includes first substructure 252 (See FIG. 8) and second substructure 254 (See FIG. 7). The crystal lattice structure represented by unit cell 250 is similar, but not identical, with the crystal lattice structure represented by unit cell 50. For example, first substructure 252 may be described as edge sharing pairs of $GeTe_4$ tetrahedra linked by square rings of Te atoms 257a, b, c and d disposed at four respective crystolographic sites. Although thallium atoms 260 and 261 may appear to be within first substructure 252 as shown in FIG. 8, all thallium atoms 260 and 261 are part of a respective second substructure 254 as shown in FIG. 7. Second substructure 254 preferably includes chains of thallium atoms 260 and 261 substantially the same as second substructure 54 of thallium atoms 60 and 61 associated with semiconductor materials such as $Tl_2SnTe_5$.

For $Tl_2GeTe_5$ semiconductor compounds and related alloys, the $GeTe_4$ tetrahedra may be described as unit A. The square $Te_4$ rings may be described as unit B. The linkage within the atomic chains of the first substructure may then be described as "AABAABAAB . . . " for semiconductor materials such as $Tl_2GeTe_5$ and their alloys.

Preliminary testing indicates that the Seebeck coefficient (S) for $Tl_2GeTe_5$ semiconductor materials may be higher than the Seebeck coefficient (S) associated with semiconductor materials such as $Tl_2SnTe_5$. Semiconductor materials such as $Tl_2GeTe_5$ melt incongruently at a temperature of approximately 270° C. Semiconductor materials such as $Tl_2SnTe_5$ melt incongruently at approximately 290° C.

Unit cell 250 as shown in FIGS. 7 and 8 preferably has two different crystallographic sites associated with thallium atoms 260 and 261.

Figure 9:
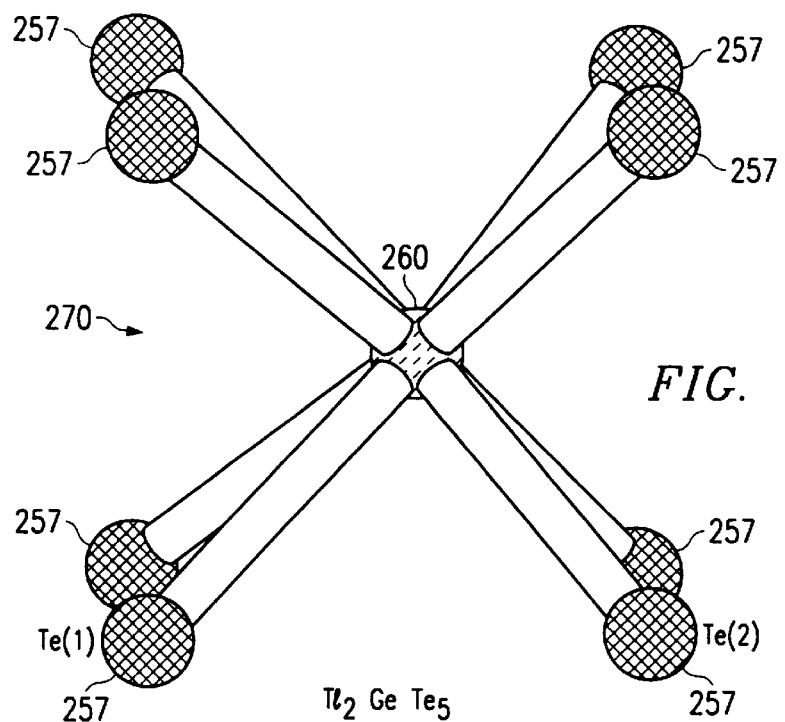
FIG. 9 is an isometric drawing showing a schematic representation of a subcell associated with thallium atoms at the first of two crystallographic sites in the crystal lattice structure of FIGS. 7 and 8 having a generally cubic configuration defined by eight atomic crystallographic sites filled with tellurium (Te) atoms and the associated atomic crystallographic site with a thallium (Tl) atom located near the center of the subcell.

FIG. 9 is a schematic representation of subcell 270 associated with first substructure 252 of unit cell 250. Subcell 270 has a general cubic configuration defined in part by eight crystallographic sites filled with respective tellurium atoms 257 and a single thallium atom 260 located at the atomic crystallographic site near the center of the resulting cubic structure. For semiconductor material such as $Tl_2GeTe_5$ the length of the bond coordination between thallium atoms 260 at the center of respective subcells 270 and tellurium atoms 257 at their respective crystallographic sites is approximately 3.39 Å for four of the tellurium atoms and approximately 3.54 Å for the other four tellurium atoms.

Figure 10:
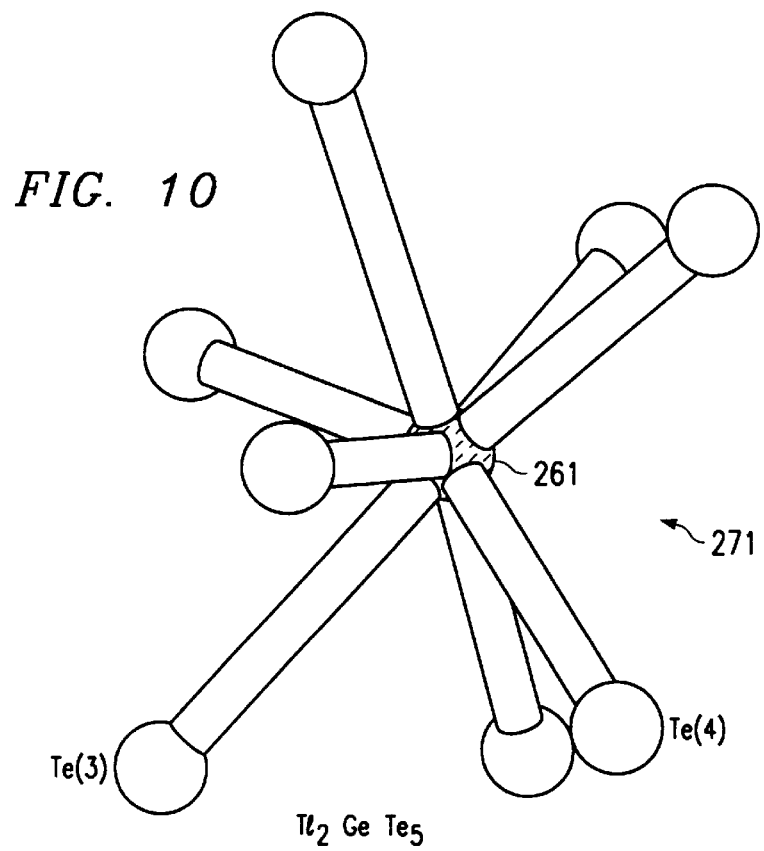
FIG. 10 is an isometric drawing showing a schematic representation of another subcell associated with thallium atoms at the second of the two crystallographic sites in the crystal lattice structure of FIGS. 7 and 8 having a generally cubic antiprism configuration defined by eight atomic crystallographic sites filled with tellurium (Te) atoms and the associated atomic crystallographic site with a thallium (Tl) atom located near the center of the subcell.

FIG. 10 is a schematic representation showing subcell 271 associated with thallium atoms 261 located at a plurality of second crystallographic sites in first substructure 252 of the crystal lattice structure represented by unit cell 250. Subcell 271 may be described as a generally cubic antiprism having eight neighboring atomic crystallographic sites filled with respective tellurium atoms 257 and thallium atom 261 located at an atomic crystallographic site near the center of the resulting cubic antiprism. The bond length between thallium atoms 261 located near the atomic crystallographic sites near the center of respective subcells 271 and tellurium atoms 257 at their respective atomic crystallographic sites is approximately 3.53 Å for four of the tellurium atoms and approximately 3.79 Å for the other four tellurium atoms.

Therefore, some of the bond distances between thallium/tellurium associated with $Tl_2SnTe_5$ are shorter than the corresponding thallium/tellurium bond distances in $Tl_2GeTe_5$ and are longer than other bond distances.

The differences between crystal structures represented by unit cells 50 and 250 may impact the electronic properties of these two compounds relative to one another. Important parameters such as the magnitude of the band gap and the morphology of the bands may differ.

Compounds incorporating teachings of the present inventions have been formed most often by melting stoichiometric or nearly stoichiometric mixtures of elements of the Periodic Table selected in accordance with teachings of the present invention, quenching and powdering the charge, cold pressing the powder and heating for a few days near the decomposition temperature. Alternatively, the powdering and cold pressing steps can be omitted. Samples have been tested after heat soaking, or after subsequent hot uniaxial or isostatic pressing and/or forging. Densities greater than 98% of the theoretical value have been reached by hot pressing. Thallium compounds $Tl_2SnTe_5$ and $Tl_2GeTe_5$ melt incongruently so melt growth of crystals must employ a non-stoichiometric solution.

The samples made to date indicate promise for the compounds by the following results:

1) a p-type ZT=0.65 at room temperature (greater than the value for $Bi_2Te_3$ crystals);
2) further improvements may occur by prolonged annealing, which seems to reduce the concentration of p-type defects and increase the carrier mobility;
3) it is possible to make alloys to further reduce the lattice thermal conductivity;
4) Seebeck coefficients in excess of 200 $\mu V/K$ have been measured, showing that suitable electronic quality can be obtained;
5) in the case of $Tl_2GeTe_5$, intrinsic samples have been obtained, which implies that n-type doping is possible;
6) hot pressed compacts show as much as 20% difference in the Z value in two perpendicular directions, suggesting a high degree of anisotropy;
7) the compounds appear to suffer no damaging reactions with air, water, or common solvents.

Various atoms may be selected to form semiconductor materials having the general formula $X_2YZ_5$ and a crystal lattice structure similar to unit cell 50 such as shown in FIGS. 3 and 4 or unit cell 250 as shown in FIGS. 7 and 8. Z atoms which interact with other Z atoms in the generally square planar environment and with adjacent X atoms and Y atoms have their chemical bonds saturated. Therefore, the Z atoms cannot easily engage in any other type of chemical bond, particularly with the Z atom in the same type of crystallographic site. As a result, a relatively long distance is established between the Z atoms in their first crystallographic site. As a result of the distance established between the respective Z atoms, relatively large channels are formed within respective unit cells 50 and 250 for the chains or rows which may be occupied by X atoms. Coordination between the X atoms and Z atoms results in relatively long bond lengths and a corresponding reduced value of thermal conductivity.

Cation atoms (Tl, K, etc.) that interact mainly with Te separate the chains. The sites for these electropositive cations are large, leading to low lattice thermal conductivity. For some applications potassium (K) or rubidium (Rb) may be preferred for use in preparing semiconductor materials in accordance with teachings of the present invention due to their less harmful chemical characteristics as compared to thallium (Tl).

The performance of these hot pressed and forged samples may represent only a fraction of the performance that can be achieved in crystal or oriented powder forms of the compounds.

Various forms of these materials may be suitable for different applications. With a 50–60% performance improvement, powder compacts will compete with the current materials in the important temperature range around 60° C. Extrusion techniques and other metallurgical processes that result in grain alignment may combine improved manufacturability with high thermoelectric performance. There are proven Z enhancements in thin film quantum structures that might be applied to these new materials.

One sample of $Tl_2SnTe_5$ was approximately phase pure and p-type, with S=165 $\mu$V/K at room temperature. The resistivity is about 4 mohm-cm. The total thermal conductivity was about 7 mW/cm-K, which is less than half of the value of $Bi_2Te_3$. The low value of lattice conductivity may be attributed to the fact that one-half of the Tl is positioned in an eight-fold coordinated lattice site with a radius of approximately 2.1 Å. The sample was hot-pressed. The crystal structure is anisotropic. N-type may be considerably better due to a more favorable conduction band structure, and a crystal probably will outperform hot-pressed samples.

For another $Tl_2SnTe_5$ sample synthesized using thallium that was cleaned (separated from hydroxide) by melting in an evacuated quartz tube. The Seebeck coefficient is around +200 $\mu$V/K, and the resistivity is ~8 mohm-cm.

Still another $Tl_2SnTe_5$ sample is a hot pressed pellet made with a slight excess of Tl, in an attempt to eliminate native hole-generating defects. The native holes remained. The sample was tested by the Harman method, and is phase pure per x-ray diffraction. The Seebeck coefficient was in a good range. The results at 337 K were: S=+200 $\mu$V/K, $\lambda$=4.9 mW/cm-K, and $\rho$=6.8 mohm-cm, ZT=0.4. The p of the sample hits a minimum at 250 K, indicating a secondary scattering contribution at 300 K. Without this contribution, the ZT just above room temperature would be approximately 0.5.

Still another sample of $Tl_2SnTe_5$ was forged rather than hot pressed. It is not as dense as hot pressed samples, only about 93% of ideal. However, the hot pressed samples often have catastrophic cracks that probably will not be present in forged samples. The relatively low density might cause the apparent reduction in carrier mobility. The resistivities of two pieces of the sample cut parallel and orthogonal to the forging direction differ by 30%, possibly due to a strong anisotropy in the transport properties.

Another $Tl_2SnTe_5$ sample was made by quenching a molten stoichiometric mixture and heating for two days at approximately 250° C. At room temperature, this sample had a Seebeck coefficient of 215 microvolts/kelvin, a resistivity of 4.2 milliohm-centimeter and a thermal conductivity of 5.2 milliwatts/centimeter-kelvin. The dimensionless figure of merit was approximately 0.63 at room temperature.

A sample of $Tl_2GeTe_5$ showed that this composition is also P-type as made and has transport properties very similar to those of $Tl_2SnTe_5$. The $Tl_2GeTe_5$ sample does have a lower concentration of native holes. It was reported in the literature that $Tl_2GeTe_5$ melts congruently at ~320° C., but that information appears to be incorrect for at least some samples.

Another $Tl_2SnTe_5$ sample was a pure compound (not alloyed). It differed from previous samples in that after cold press and anneal, the compact was hot pressed without grinding. Grinding may introduce oxygen contamination that is not overcome by hot pressing. A $Tl_2SnTe_5$ sample was alloyed with Se in an attempt to decrease the native hole concentration, then add holes by substituting Ga for Sn. There was apparently a net increase in the hole concentration based on the Seebeck value. However, there was not a corresponding drop in the resistivity. Higher hot press temperature could be used. Antimony (Sb) and indium (In) may also be satisfactory used as a P-type doping material. For a 50/50 mixture of $Tl_2SnTe_5$ and $Tl_2GeTe_5$, the Seebeck coefficient after hot press was 236 $\mu$V/K, much closer to that of $Tl_2GeTe_5$ than $Tl_2SnTe_5$. This sample is about 97% dense. The resistivity decreased by a factor of 3 between the cold pressed and the hot pressed stages. Another sample was alloyed with 10% Se and doped with iodine (I) to try to make an N-type sample. It was a high resistivity P-type sample.

Another sample of $Tl_2GeTe_5$ was a Pb-doped, hot pressed sample. It showed a Seebeck peak of 290 $\mu$V/K at 280 K, from which the band gap is estimated to be 0.16 eV. Ensuing $Tl_2GeTe_5$ samples will be doped with Pb and perhaps Sr to try for N-type samples. With a lower native hole concentration, $Tl_2GeTe_5$ may be preferable to $Tl_2SnTe_5$ for making N-type samples. Alloying with Si may be possible.

DESCRIPTION OF SYNTHESIS OF SEMICONDUCTOR MATERIALS INCORPORATING TEACHINGS OF THE PRESENT INVENTION a) Load stoichiometric or nearly stoichiometric amounts of raw elements of the Periodic Table into quartz tube. The interior of the tube is coated with a glassy carbon film. Germanium, tin, selenium and tellurium may be handled in air if desired. Potassium, rubidium and thallium should be handled in an inert atmosphere.

b) Evacuate the tube to <$10^{-4}$ Torr and seal it.

c) Heat tube to approximately 750° C. and hold for one hour with at least occasional agitation.

d) Remove tube from oven and quench sample in water.

e) Grind sample in inert atmosphere, sieving to ensure all particles are below a specified size. Particle size limits of seventy five microns and two hundred fifty microns have been used.

f) Press powder at room temperature. The pressure used has been ~60,000 pounds per square inch.

g) Heat sample for one to three days at a temperature just less than the melting point. The typical temperatures are 255° C. for $Tl_2GeTe_5$ and 270° C. for $Tl_2SnTe_5$. After heat treat, the samples are typically 85% to 90% dense.

h) Densify by simultaneous application of heat and pressure (hot press). With typical operating conditions of 250° C. to 275° C. and 6000 pounds per square inch, the density of the samples reaches 95% to 99% of the full density after two hours of hot pressing.

Steps e, f and h are optional. That is, samples of relatively good quality can be obtained simply by heating the quenched melt.

Although the present invention has been described by several embodiments, various changes and modifications may be suggested to one skilled in the art. It is intended that the present invention encompasses such changes and modifications as fall within the scope of the present appended claims.

APPENDIX

| DEFINITIONS AND EXPLANATION OF SYMBOLS | |
|---|---|
| Thermoelectric Figure of Merit | ZT |
| Absolute Temperature | T |
| Seebeck coefficient | S |
| Electrical Conductivity | $\sigma$ |
| Electrical Resistivity | $\rho$ |
| Electrical Properties of Materials Used to Form Thermoelectric Elements | $S^2\sigma$ |
| Thermal Conductivity | $\kappa$ |
| Electronic Component of Thermal Conductivity | $\kappa_e$ |
| Lattice Component of Thermal Conductivity | $\kappa_g$ |
| Angstrom | Å |

| ELEMENTS | SYMBOL |
|---|---|
| Antimony | Sb |
| Arsenic | As |
| Bismuth | Bi |
| Cadmium | Cd |
| Cesium | Cs |
| Cobalt | Co |
| Copper | Cu |
| Gallium | Ga |
| Germanium | Ge |
| Iodine | I |
| Indium | In |
| Iridium | Ir |
| Iron | Fe |
| Lanthanum | La |
| Lead | Pb |
| Mercury | Hg |
| Nickel | Ni |
| Niobium | Nb |
| Palladium | Pd |
| Phosphorous | P |
| Platinum | Pt |
| Potassium | K |
| Rhodium | Rh |
| Rubidium | Rb |
| Ruthenium | Ru |
| Samarium | Sm |
| Selenium | Se |
| Silicon | Si |
| Silver | Ag |
| Sodium | Na |
| Sulphur | S |
| Strontium | Sr |
| Thallium | Tl |

| APPENDIX-continued | |
|---|---|
| Tellurium | Te |
| Tin | Sn |
| Xenon | Xe |
| Zinc | Zn |

What is claimed is:

1. A thermoelectric device, comprising:

(a) at least one p-type thermocouple and at least one n-type thermocouple, each p-type thermocouple and each n-type thermocouple having a hot side and a cold side, wherein at least one of the thermocouples comprises a ternary semiconductor compound having a single pure phase and having a formula;

$$X_2YZ_5$$

wherein X is selected from the group consisting of Tl, Cu, Ag, In, Cs, K, Na and Rb;
Y is selected from the group consisting of Si, Ge, and Sn; and
Z is selected from the group consisting of Te and Se;

(b) a first electrical conductor electrically connected to the hot side of the at least one p-type thermocouple;

(c) a second electrical conductor electrically connected to the cold side of the at least one p-type thermocouple and the cold side of the at least one n-type thermocouple; and (d) a third electrical conductor electrically connected to the hot side of the at least one n-type thermocouple.

2. The thermoelectric device of claim 1, wherein the ternary semiconductor compound further comprises a p-type doping material.

3. The thermoelectric device of claim 2, wherein the p-type doping material is selected from the group consisting of gallium, antimony, iodine, and indium.

4. The thermoelectric device of claim 1, wherein the ternary semiconductor compound further comprises an n-type doping material.

5. The thermoelectric device of claim 1, wherein the formula is selected from the group consisting of $K_2SnTe_5$, $Rb_2SnTe_5$, and $Tl_2SnTe_5$.

6. The thermoelectric device of claim 1, wherein the ternary semiconductor compound has a thermoelectric figure of merit ZT equal to or greater than 0.4.

* * * * *